United States Patent
Lee

(10) Patent No.: US 7,486,007 B2
(45) Date of Patent: Feb. 3, 2009

(54) FLAT PANEL DISPLAY DEVICE

(75) Inventor: Sun-Youl Lee, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 455 days.

(21) Appl. No.: 11/253,654

(22) Filed: Oct. 20, 2005

(65) Prior Publication Data
US 2006/0103285 A1    May 18, 2006

(30) Foreign Application Priority Data
Nov. 18, 2004    (KR) .................... 10-2004-0094507

(51) Int. Cl.
*H01J 1/52* (2006.01)
(52) U.S. Cl. .................... 313/239; 313/112; 313/470; 349/96; 359/485; 362/19; 40/548
(58) Field of Classification Search .................... None
See application file for complete search history.

(56) References Cited

U.S. PATENT DOCUMENTS

| 7,038,746 | B2* | 5/2006 | Tominaga et al. ............. 349/96 |
| 2001/0028424 | A1 | 10/2001 | Maeda |
| 2004/0160674 | A1* | 8/2004 | Suga et al. .................... 359/603 |
| 2007/0189024 | A1* | 8/2007 | Nanbu et al. ................. 362/458 |
| 2007/0236631 | A1* | 10/2007 | Ohtani et al. ................. 349/96 |

FOREIGN PATENT DOCUMENTS

| EP | 0 502 364 | 9/1992 |
| JP | 61-002625 | 1/1986 |
| JP | 63-314522 | 12/1988 |
| JP | 05-080291 | 4/1993 |
| JP | 2001-051263 | 2/2001 |
| JP | 2003-099193 | 4/2003 |
| JP | 2003-257660 | 9/2003 |
| JP | 2004-338379 | 12/2004 |
| KR | 2003-0022470 | 3/2003 |
| KR | 10-2003-0057016 | 7/2003 |
| KR | 10-2004-0054829 | 6/2004 |

OTHER PUBLICATIONS

European Office Action of the European Patent Application No. 05 11 0593, mailed on Mar. 15, 2006.
Korean Office Action of the Korean Patent Application No. 2004-94507, mailed on May 19, 2006.

(Continued)

*Primary Examiner*—Ashok Patel
(74) *Attorney, Agent, or Firm*—Robert E. Bushnell, Esq.

(57) ABSTRACT

A flat panel display device has a conductive layer formed between a substrate and a polarization plate to prevent static electricity from appearing between the substrate and the polarization plate, thereby improving screen display quality. The flat panel display device includes: a flat display panel including a substrate having an image display unit, a display element arranged on the image display unit of the substrate, and a sealing unit for sealing the display element; a polarization member arranged on at least one of the substrate and the sealing unit; and a shielding member arranged at a portion that does not correspond to the image display unit of the substrate in order to prevent the appearance of static electricity between the substrate and the polarization member.

12 Claims, 5 Drawing Sheets

OTHER PUBLICATIONS

European Search Report corresponding European Patent Application No. 05110593.0-2203, issued on Aug. 9, 2007.

*Search Report* from the European Patent Office issued in Applicant's corresponding European Patent Application No. 05 110 593.0-2214 dated Mar. 10, 2008.

*Office Action* from the Japanese Patent Office issued in Applicant's corresponding Japanese Patent Application No. 2005-289125 dated Aug. 19, 2008.

\* cited by examiner

FLAT PANEL DISPLAY DEVICE

CLAIM OF PRIORITY

This application makes reference to, incorporates the same herein, and claims all benefits accruing under 35 U.S.C. §119 from an application for FLAT PANEL DISPLAY DEVICE earlier filed in the Korean Intellectual Property Office on Nov. 18, 2004 and there duly assigned Serial No. 10-2004-0094507.

BACKGROUND OF THE INVENTION

1. Technical Field

The present invention relates to a flat panel display device and, more particularly, to an organic light emitting diode (OLED) having a unit for preventing formation of static electricity between a polarization plate and a substrate.

2. Related Art

In general, active-matrix organic light-emitting diodes (AMOLEDs) include a plurality of pixels arranged on a substrate. Each of the pixels includes at least one switching thin film transistor, one driving thin film transistor, a capacitor, and an organic electroluminescence (EL) element. An organic EL element is a self emission element which is driven by a thin film transistor. The organic EL element includes an anode electrode, an organic layer having a light emitting layer, and a cathode electrode, and it emits light from the light emitting layer of the organic layer according to voltages applied between the anode electrode and the cathode electrode.

Since the thin film transistor and the capacitor that form an OLED include an electrode made of a metallic material and an interconnection, external light is reflected by the metal electrode and interconnection so that the contrast of the OLED is greatly degraded.

The contrast of a flat panel display device, such as an OLED, is greatly reduced according to the intensity of external light. Thus, in the conventional OLED, a polarization plate is attached to a substrate so as to prevent reduction of contrast caused by external light.

An organic electroluminescence display device includes an organic electroluminescence (EL) display panel, a polarization plate, and a bracket for supporting the organic EL display panel. The organic EL display panel includes an upper substrate and a lower substrate. The organic EL display panel further includes an organic EL element formed between the upper substrate and the lower substrate.

In the organic electroluminescence display device having the above structure, static electricity induced between the polarization plate and the substrate causes malfunction of the organic EL element or affects the electrostatic capacity of a capacitor so that picture quality is lowered. In addition, due to the static electricity induced between the polarization plate and the substrate, an image display region is destroyed so that a desired image cannot be displayed.

SUMMARY OF THE INVENTION

The present invention provides a flat panel display device in which appearance of static electricity is prevented by using a conductive layer between a substrate and a polarization plate.

According to an aspect of the present invention, a flat panel display device includes: a flat display panel including a substrate having an image display unit, a display element arranged on the image display unit of the substrate, and a sealing unit for sealing the display element; a polarization member arranged on at least one of the substrate and the sealing unit; and a shielding member arranged at a portion that does not correspond to the image display unit of the substrate in order to prevent appearance of static electricity between the substrate and the polarization member.

The shielding member includes a shielding film arranged at an outline of the polarization member that does not correspond to the image display unit. The shielding member may be arranged at the substrate or the sealing unit in which the polarization member is arranged, and may include a shielding film arranged at an outline of the polarization member that does not correspond to the image display unit. The shielding member may be formed in a closed loop shape.

The shielding member includes a conductive film selected from a conductive metallic film and a conductive nonmetallic film. The shielding member may include a conductive film selected from a transparent conductive film and an opaque conductive film.

The flat display panel is an electroluminescence (EL) display panel.

According to another aspect of the present invention, a flat panel display device includes: a flat panel display panel including a substrate having an image display unit, a display element arranged on the image display unit of the substrate, and a sealing unit for sealing the display element; a polarization member arranged on at least one of the substrate and the sealing unit; and a shielding member arranged at a portion that corresponds to the image display unit of the substrate in order to prevent appearance of static electricity between the substrate and the polarization member.

The shielding member includes a shielding film arranged at a portion of the polarization member that corresponds to the image display unit. The shielding member may be arranged at the substrate or the sealing unit in which the polarization member is arranged, and may include a shielding film arranged at a portion of the polarization member that corresponds to the image display unit. The shielding member may be formed in a mesh shape.

The shielding member includes a conductive film selected from a conductive metallic film and a conductive nonmetallic film. The shielding member may include a transparent conductive film.

The flat display panel is an electroluminescence (EL) display panel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
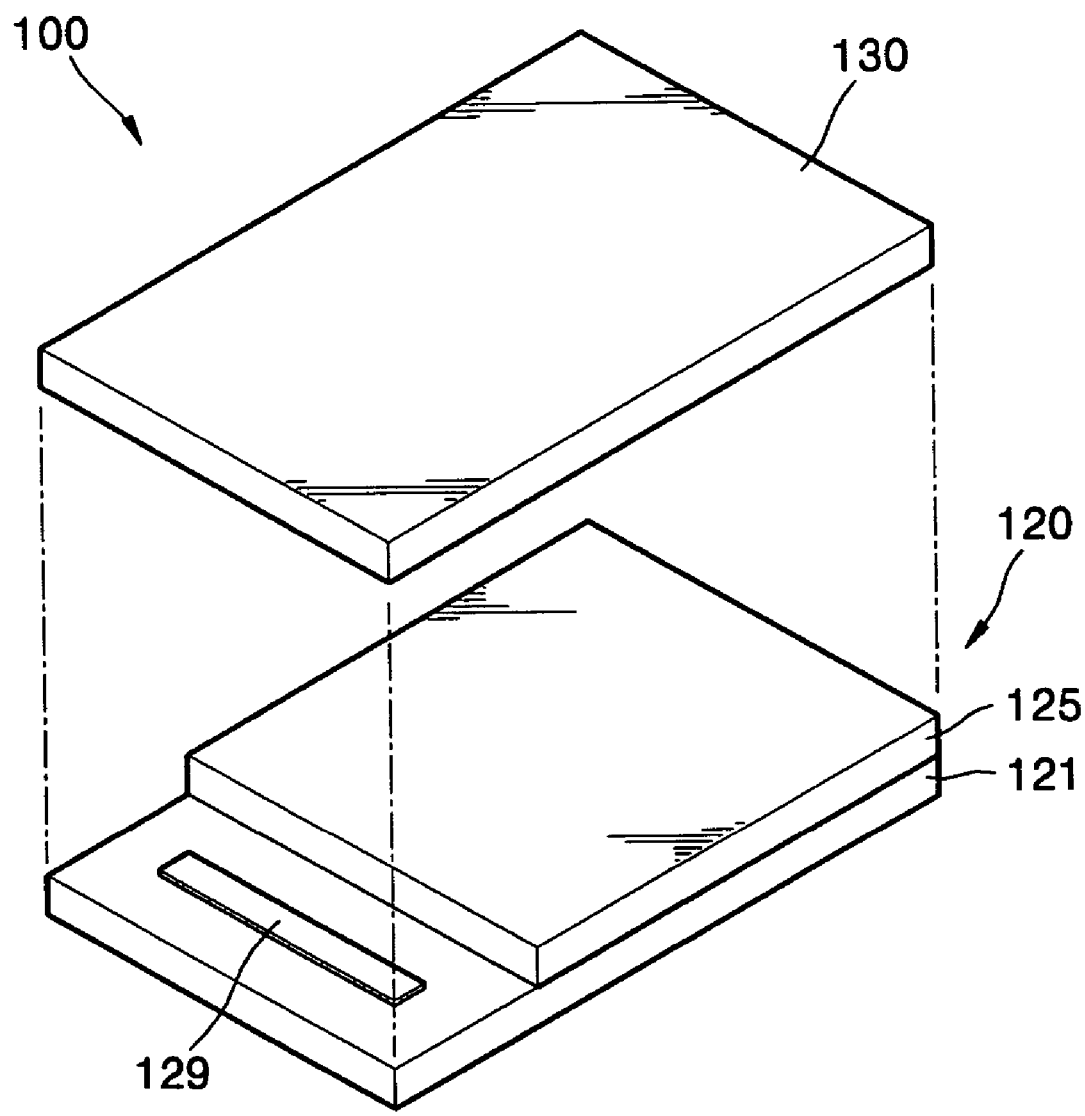
FIG. 1 is an exploded perspective view of an organic electroluminescence display device.

FIG. 1 is an exploded perspective view of an organic electroluminescence display device. Referring to FIG. 1, the organic electroluminescence display device 100 includes an organic electroluminescence (EL) display panel 120, a polarization plate 130, and a bracket (not shown) for supporting the organic EL display panel 120. The organic EL display panel 120 includes an upper substrate 125 and a lower substrate 121. Although not shown, the organic EL display panel 120 further includes an organic EL element formed between the upper substrate 125 and the lower substrate 121. In FIG. 1, reference numeral 129 denotes a driving IC.

In the organic electroluminescence display device having the above structure, static electricity induced between the polarization plate 130 and the substrate 125 causes malfunction of the organic EL element or affects the electrostatic capacity of a capacitor so that picture quality is lowered. In addition, due to the static electricity induced between the polarization plate 130 and the substrate 125, an image display region is destroyed so that a desired image cannot be displayed.

Figure 2:
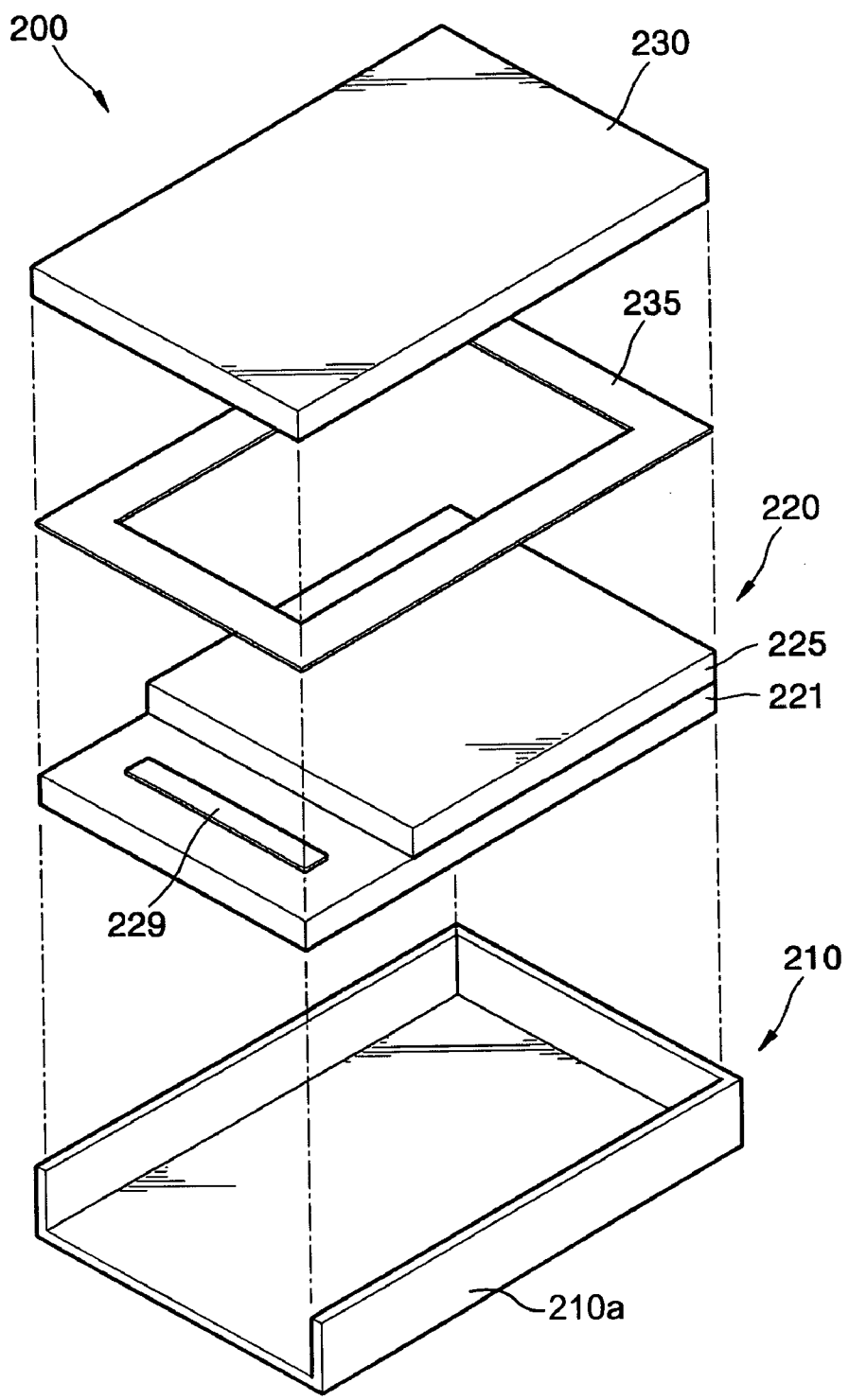
FIG. 2 is an exploded perspective view of an organic electroluminescence display device according to an embodiment of the present invention.

FIG. 2 is an exploded perspective view of an organic electroluminescence display device according to an embodiment of the present invention. Referring to FIG. 2, the organic electroluminescence display device 200 includes an organic electroluminescence (EL) display panel 220, a bracket 210 for supporting the organic EL display panel 220, and a polarization member 230 which intercepts external light incident on the organic EL display panel 220.

The bracket 210 supports the organic EL display panel 220, is formed in a plate shape having a size corresponding to the organic EL display panel 220, and has an open side barrier rib 210a. The bracket 210 shown in FIG. 2 is not limited to the above structure, and may be formed in a variety of structures for supporting the organic EL display panel 220.

The polarization member 230 prevents external light from reaching a sealing unit 225 of the organic EL display panel 220. As the polarization member 230, a polarization plate may be used as shown in FIG. 2, or a polarization material layer may be coated on the sealing unit 225.

Figure 3:
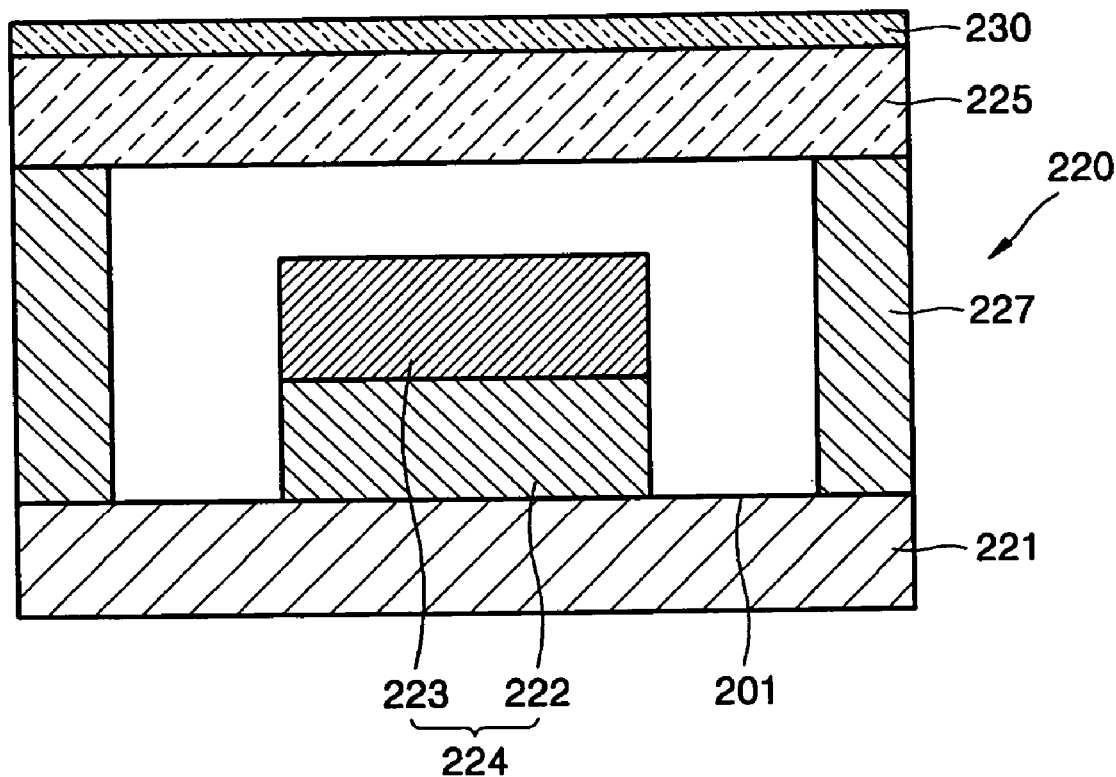
FIG. 3 is a cross-sectional view of an organic electroluminescence (EL) panel of the organic electroluminescence display device shown in FIG. 2.

FIG. 3 is a cross-sectional view of the organic electroluminescence (EL) display panel of the organic electroluminescence display device shown in FIG. 2, which is a cross-sectional view of one unit pixel. Referring to FIG. 3, the organic EL display panel 220 includes a lower substrate 221 and a sealing unit (for example, an upper substrate 225) for sealing the lower substrate 221 using a sealant 227. The lower substrate 221 includes an image display unit 201 which displays a desired image.

The image display unit 201 displays an image using light emitted from an organic EL element (not shown). A plurality of pixels 224 are arranged on the image display unit 201 of the lower substrate 221 in a matrix shape, and each of the pixels 224 includes an organic electroluminescence (EL) element 223 and a thin film transistor 222 which is a driving element for driving the organic EL element 223.

The image display unit 201 of the lower substrate 221 is sealed by the sealing unit 225 using a sealant 227 so as to protect the image display unit 201 from the outside. Since the organic electroluminescence display device shown in FIGS. 2 and 3 has a front emission structure in which light emitted from the organic EL element 223 is emitted toward the sealing unit 225, a polarization member 230 for intercepting external light is arranged on the exterior of the sealing unit 225.

In the organic electroluminescence display device 200 shown in FIG. 2, the organic EL display panel 220 is not limited to the structure of FIG. 3, and the organic electroluminescence (EL) element and the thin film transistor for driving the organic EL element may have a variety of structures.

In the embodiment shown in FIG. 2, the polarization member 230 is attached to the outside of the sealing unit 225 of the organic EL display panel 220. The present invention is not limited to this, and the polarization member 230 may be arranged at the interior of the sealing unit 225 according to the type of the polarization member 230.

Figure 5:
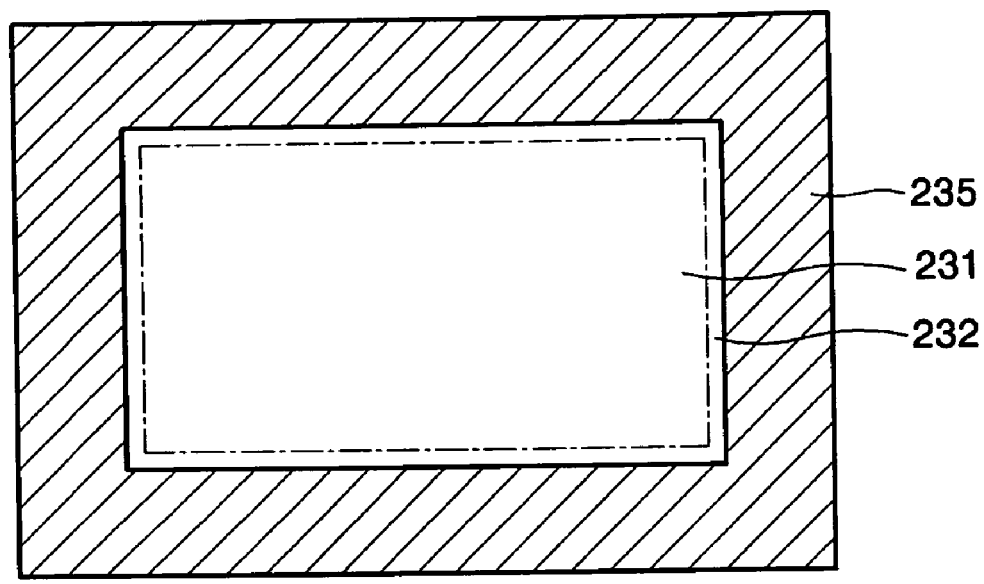
FIG. 5 is a plan view of a shielding member for preventing appearance of static electricity in the organic electroluminescence display device shown in FIG. 2.

The organic electroluminescence display device 200 shown in FIG. 2 further includes a shielding member 235, which is disposed between the sealing unit 225 of the organic EL panel 220 and the polarization member 230, and which prevents static electricity. As seen in FIG. 5, the shielding member 235 is arranged to correspond to an outline 232 of the polarization member 230, excluding a portion 231 that corresponds to the image display unit 201 of the organic EL display device 200. The shielding member 235 may be formed in a closed loop shape.

The shielding member 235 of FIG. 2 for preventing the appearance of static electricity can be made of a variety of types of conductive materials, such as a conductive metallic film, a conductive nonmetallic film, a transparent conductive film, and an opaque conductive film.

The shielding member 235 may be formed in various shapes, such as that of a conductive plate, a conductive film, or a conductive thin film. The shielding member 235 may be separated from the polarization member 230 and arranged between the polarization member 230 and the sealing unit 225, or it may be attached to the polarization member 230 or formed by various methods, such as patterning or coating on the polarization member 230.

The shielding member 235 of FIG. 2 has a frame shape as shown in FIG. 5, but it is not limited to that shape. The shielding member 235, having a variety of shapes for preventing the appearance of static electricity, may be arranged at the outline 232 (FIG. 5) of the polarization member 230 (FIG. 2). In addition, the shielding member 235 may be arranged at an outline of the sealing unit 225 of the organic EL display panel 220. In FIG. 2, reference numeral 229 denotes a driving IC.

Figure 4:
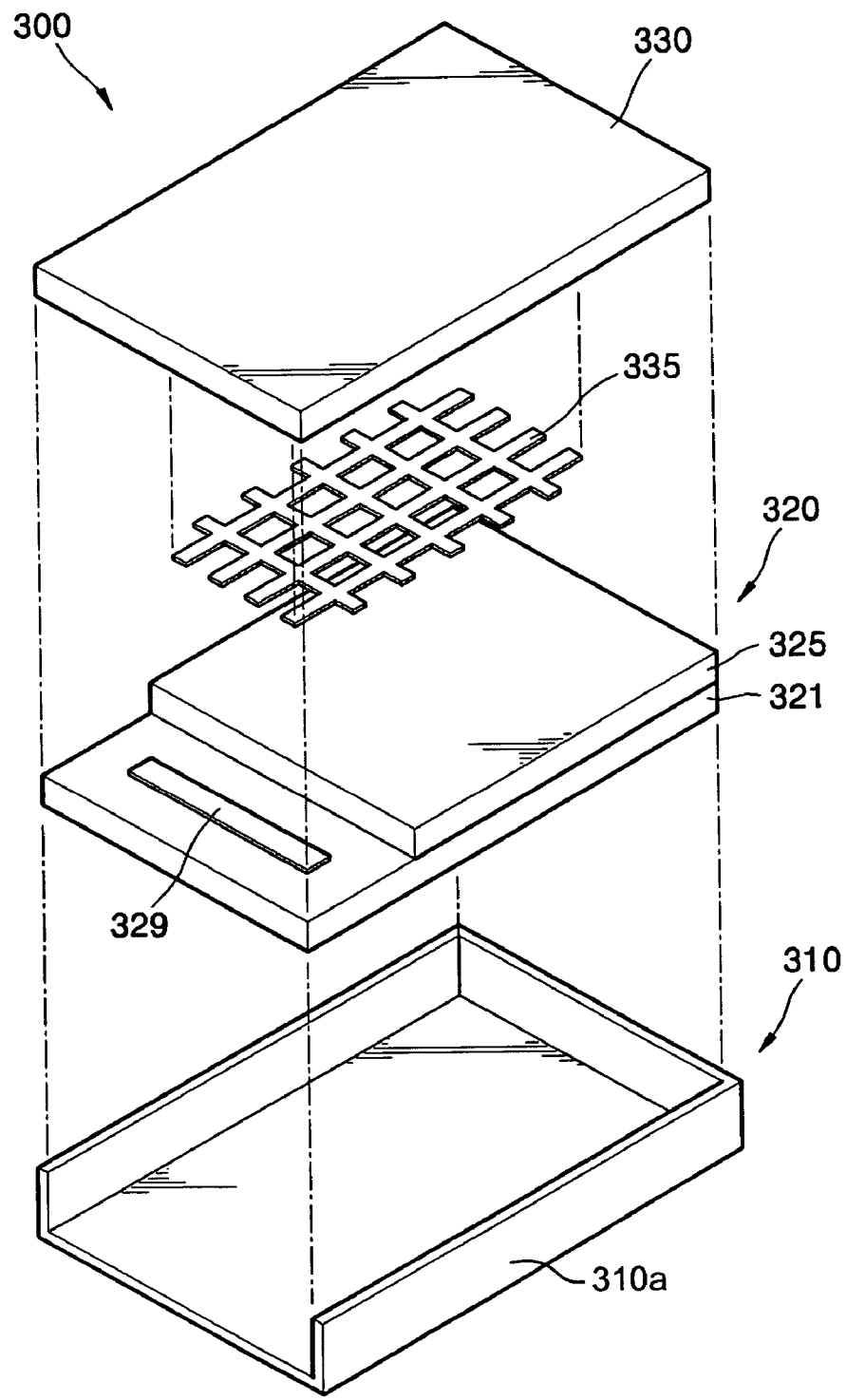
FIG. 4 is an exploded perspective view of an organic electroluminescence display device according to another embodiment of the present invention.

FIG. 4 is an exploded perspective view of the organic electroluminescence display device according to another embodiment of the present invention. Referring to FIG. 4, the organic electroluminescence display device 300 includes an organic electroluminescence (EL) display panel 320, a bracket 310 for supporting the organic EL display panel 320, and a polarization member 330 which intercepts external light incident or the organic EL display panel 320, as in FIG. 2.

The bracket 310 supports the EL display panel 320, is formed in a plate shape having a size corresponding to the organic EL display panel 320, and has an open side barrier rib 310a. In addition, as in FIG. 2, the polarization member 330 prevents external light from reaching a sealing unit 325 of the organic EL display panel 320. A polarization plate may be used as the polarization member 330, or a polarization material layer may be coated on the sealing unit 325.

The organic EL display panel 320 has a cross-sectional structure as shown in FIG. 3. That is, the organic EL display panel 320 includes a lower substrate 321 having an image display unit 201, and a sealing unit (for example, an upper substrate 325) for sealing the lower substrate 321 using a sealant 227.

The image display unit 201 displays an image using light emitted from the organic EL element (not shown). As shown in FIG. 3, a plurality of pixels 224 are arranged on the image display unit 201 in a matrix shape, and each of the pixels 224 includes an organic electroluminescence (EL) element 223 and a thin film transistor 222 which is a driving element for driving the organic EL element 223. In FIG. 4, reference numeral 329 denotes a driving IC.

Since the organic electroluminescence display device shown in FIG. 4 has a front emission structure in which light emitted from the organic EL element 223 is emitted toward the sealing unit or upper substrate 325, a polarization member 330 for intercepting external light is arranged at the exterior of the sealing unit or upper substrate 325.

The organic electroluminescence display device 300 shown in FIG. 4 further includes a shielding member 335, which is disposed between the sealing unit 325 of the organic EL display panel 320 and the polarization member 330, and which prevents the appearance of static electricity therebetween.

The shielding member 335 is arranged at a portion 331 (see FIG. 6) that corresponds to the image display unit 201 (FIG. 3) of the organic EL display panel 320 (FIG. 4) of the polarization member 330. The shielding member 335 may be formed in a mesh shape.

Unlike in FIG. 2, since the shielding member 335 of FIG. 4 for preventing the appearance of static electricity is arranged not at an outline 332 (FIG. 6) of the polarization member 330, but at a portion 331 corresponding to the image display unit 201 (FIG. 3), the shielding member 335 of FIG. 4 may include a transparent conductive material through which light emitted from the organic EL element 223 is transmitted.

The shielding member 335 of FIG. 4 may be made of a variety of conductive materials, such as a conductive metallic film or a conductive nonmetallic film, and may be formed in various shapes, such as that of a conductive plate, a conductive film, or a conductive thin film.

The shielding member 335 may be separated from the polarization member 330 and arranged between the polarization member 330 and the sealing unit 325, or it may be attached to the polarization member 330 or formed by various methods, such as patterning or coating on the polarization member 330.

In the embodiment shown in FIG. 4, the shielding member 335 for preventing the appearance of static electricity is arranged in a mesh shape at the portion 331 (FIG. 6) that corresponds to the image display unit 201 (FIG. 3) of the polarization member 330 of FIG. 4, but the present invention is not limited to that arrangement. The shielding member 335 having a variety of shapes may be arranged at the central portion 331 (FIG. 6) of the polarization member 330 of FIG. 4. In addition, the shielding member 335 may be arranged at a portion that corresponds to the image display unit 201 (FIG. 3) of the sealing unit 325 (FIG. 4) of the organic EL display panel 320.

Figure 6:
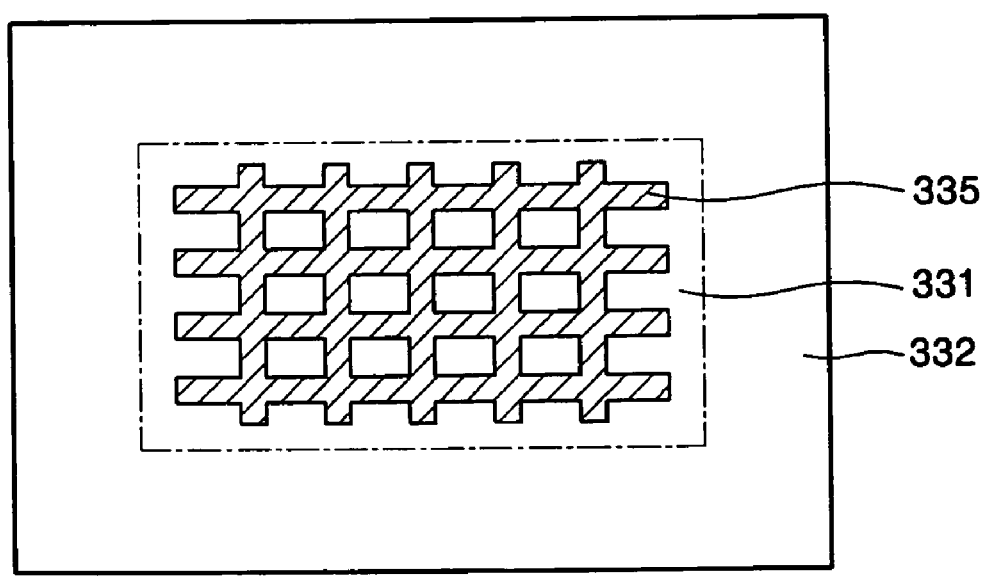
FIG. 6 is a plan view of a shielding member for preventing appearance of static electricity in the organic electroluminescence display device shown in FIG. 4.

In the embodiment of the present invention, in the organic electroluminescence display device having a front emission structure in which light emitted from the organic EL display panel is emitted in a direction opposite to that of the substrate, that is, toward the sealing unit, the polarization member is attached to the exterior of the sealing unit so as to prevent external light from being incident on the sealing unit, and a conductive film shown in FIG. 5 or 6 for preventing the appearance of static electricity is arranged between the sealing unit of the organic EL panel and the polarization plate. However, the present invention is not limited to this, and may be applied to an organic electroluminescence display device having a rear emission structure or to an electroluminescence display device having a both-side emission structure.

That is, in the organic electroluminescence display device having the rear emission structure in which light emitted from the organic EL panel is emitted in the direction of the substrate, a polarization member for preventing external light from reaching the substrate is attached to the exterior of the substrate, and a conductive film shown in FIG. 5 or 6 for preventing the appearance of static electricity may be arranged between the substrate and the polarization member.

In the organic electroluminescence display device having the both-end emission structure in which light emitted from the organic EL panel is emitted toward both sides of the substrate and the sealing unit, which is a direction opposite to that of the substrate, upper and lower polarization members for preventing external light incident on the substrate and the sealing unit are attached to the exteriors of the substrate and the sealing unit, and a conductive film shown in FIG. 5 or 6 for preventing the appearance of static electricity may be arranged between the substrate and the lower polarization member, and between the sealing unit and the upper polarization member.

In the organic electroluminescence display device, the shielding member for preventing the appearance of static electricity between the substrate and the polarization plate is formed on the polarization plate or the substrate, but the present invention is not limited to such an arrangement, and may be applied to a flat panel display device using a polarization plate, such as a liquid crystal display (LCD).

Although the present invention illustrates active-matrix organic light emitting diodes (AMOLEDs) in which an organic EL element forming pixels is driven by a thin film transistor, it may be applied to passive-matrix organic light-emitting diodes (PMOLEDs).

In the organic electroluminescence display device, the conductive film is formed between the substrate and the polarization member so that the appearance of static electricity between the substrate and the polarization member is prevented, and screen display quality can be improved.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:
1. A flat panel display device, comprising:
  a flat display panel including a substrate having an image display unit;
  a display element arranged on the image display unit of the substrate, and including a sealing unit for sealing the display element;
  a polarization member arranged on at least one of the substrate and the sealing unit; and
  a shielding member disposed between the substrate and the polarization member for preventing an appearance of static electricity between the substrate and the polarization member;
  wherein the shielding member is formed in a closed loop shape.

2. The flat panel display device of claim 1, wherein the shielding member includes a shielding film arranged at an outline of the polarization member that does not correspond to the image display unit.

3. The flat panel display device of claim 1, wherein the shielding member is arranged at one of the substrate and the sealing unit in which the polarization member is arranged, and includes a shielding film arranged at an outline of the polarization member that does not correspond to the image display unit.

4. The flat panel display device of claim 1, wherein the shielding member includes a conductive film comprising one of a conductive metallic film and a conductive nonmetallic film.

5. The flat panel display device of claim 1, wherein the shielding member includes a conductive film comprising one of a transparent conductive film and an opaque conductive film.

6. The flat panel display device of claim 1, wherein the flat display panel is an electroluminescence (EL) display panel.

7. A flat panel display device, comprising:
a flat panel display panel including a substrate having an image display unit,
a display element arranged on the image display unit of the substrate, and including a sealing unit for sealing the display element;
a polarization member arranged on at least one of the substrate and the sealing unit; and
a shielding member disposed between the substrate and the polarization member for preventing an appearance of static electricity between the substrate and the polarization member;
wherein the shielding member is formed in a mesh shape.

8. The flat panel display device of claim 7, wherein the flat display panel is an electroluminescence (EL) display panel.

9. The flat panel display device of claim 7, wherein the shielding member includes a shielding film arranged at a portion of the polarization member that corresponds to the image display unit.

10. The flat panel display device of claim 7, wherein the shielding member is arranged at one of the substrate and the sealing unit in which the polarization member is arranged, and includes a shielding film arranged at a portion of the polarization member that corresponds to the image display unit.

11. The flat panel display device of claim 7, wherein the shielding member includes a conductive film comprising one of a conductive metallic film and a conductive nonmetallic film.

12. The flat panel display device of claim 7, wherein the shielding member includes a transparent conductive film.

* * * * *